(12) United States Patent
Cohen et al.

(10) Patent No.: US 11,105,875 B2
(45) Date of Patent: Aug. 31, 2021

(54) SIMULTANEOUSLY FREQUENCY- AND PHASE-SHIFTED NMR SIGNALS AND IMPROVED NMR SIGNAL ANALYSIS

(71) Applicant: Aspect AI Ltd., Shoham (IL)

(72) Inventors: Itai Cohen, Herzliya (IL); Yoram Cohen, Yarkona (IL); Tal Cohen, Herzlia (IL)

(73) Assignees: Aspect Imaging Ltd., Shoham (IL); Aspect AI Ltd., Shoham (IL)

( * ) Notice: Subject to any disclaimer, the term of this patent is extended or adjusted under 35 U.S.C. 154(b) by 732 days.

(21) Appl. No.: 15/481,588

(22) Filed: Apr. 7, 2017

(65) Prior Publication Data

US 2018/0074142 A1 Mar. 15, 2018

Related U.S. Application Data

(60) Provisional application No. 62/393,345, filed on Sep. 12, 2016.

(51) Int. Cl.
*G01R 33/46* (2006.01)
*G01R 33/565* (2006.01)
*G01N 24/08* (2006.01)

(52) U.S. Cl.
CPC ........ *G01R 33/4625* (2013.01); *G01N 24/08* (2013.01); *G01R 33/56563* (2013.01)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS

| 4,694,250 A | 9/1987 | Iwaoka et al. |
| 5,218,299 A * | 6/1993 | Dunkel .............. G01R 33/3875 324/307 |

(Continued)

OTHER PUBLICATIONS

Norris et al., Online Motion Correction for Diffusion-Weighted Imaging Using Navigator Echoes: Application to RARE Imaging Without Sensitivity Loss, Magnetic Resonance in Medicine, 2001, 45:729-733.

(Continued)

*Primary Examiner* — Tung X Nguyen
*Assistant Examiner* — Robert P Alejnikov, Jr.
(74) *Attorney, Agent, or Firm* — Loeb & Loeb LLP

(57) ABSTRACT

A method for a NMR device to determine NMR measurement results of a sample from a set of RF signals emitted by the sample and received by the NMR device is disclosed. The method can include: receiving a plurality of RF signals emitted by the sample; determining a phase shift of each signal of the plurality of RF signals; correcting a phase of each signal of the plurality of RF signals; determining a frequency shift of each signal of the plurality of RF signals; shifting each signal of the plurality of RF signals to the predetermined; correcting an additional phase shift of each signal of the shifted plurality of RF signals to generate corresponding plurality of corrected RF signals; and averaging the corrected RF signals to determine the NMR measurement result. In some embodiments, the receiving, determining, correcting, shifting and/or averaging is done by the NMR device.

17 Claims, 8 Drawing Sheets

(58) Field of Classification Search
CPC .......... G01R 33/4826; G01R 33/4828; G01R 33/483; G01R 33/4831; G01R 33/4833; G01R 33/4835; G01R 33/4836; G01R 33/4838; G01R 33/5602; G01R 33/5617
USPC ........................................................ 324/309
See application file for complete search history.

(56) References Cited

U.S. PATENT DOCUMENTS

| | | | |
|---|---|---|---|
| 5,268,640 A | 12/1993 | Du et al. | |
| 5,450,010 A | 9/1995 | Van Der Meulen et al. | |
| 5,838,156 A * | 11/1998 | Miyabayashi | G01R 33/4625 324/307 |
| 5,928,146 A | 7/1999 | Itagaki et al. | |
| 6,011,392 A | 1/2000 | Zhou et al. | |
| 6,472,872 B1 * | 10/2002 | Jack, Jr. | G01R 33/3875 324/307 |
| 6,516,210 B1 | 2/2003 | Foxall | |
| 6,771,069 B2 | 8/2004 | Asano et al. | |
| 6,781,375 B2 | 8/2004 | Miyazaki et al. | |
| 7,170,289 B2 | 1/2007 | Kumai et al. | |
| 7,224,941 B2 * | 5/2007 | Liu | H04B 17/20 324/309 |
| 7,715,899 B2 | 5/2010 | Harvey et al. | |
| 8,593,141 B1 | 11/2013 | Radparvar et al. | |
| 9,041,393 B2 | 5/2015 | Warntjes | |
| 2002/0149366 A1 | 10/2002 | Asano et al. | |
| 2003/0229456 A1 | 12/2003 | Beger et al. | |
| 2007/0249929 A1 | 10/2007 | Jeong et al. | |
| 2007/0276221 A1 | 11/2007 | Warntjes | |
| 2011/0221439 A1 | 9/2011 | Posse | |
| 2011/0267057 A1 * | 11/2011 | He | G01R 33/4828 324/314 |
| 2013/0178734 A1 | 7/2013 | Wald et al. | |
| 2014/0266195 A1 * | 9/2014 | Levin | G01R 33/56509 324/309 |
| 2014/0296695 A1 | 10/2014 | He | |
| 2015/0015258 A1 * | 1/2015 | Fautz | G01R 33/246 324/309 |
| 2015/0077102 A1 | 3/2015 | Mandal et al. | |
| 2016/0321424 A1 | 11/2016 | Otovos et al. | |

OTHER PUBLICATIONS

Ting et al., Thin-section MR Imaging of rat brain at 4.7T, JMRI 1992; 2:393-399.

* cited by examiner

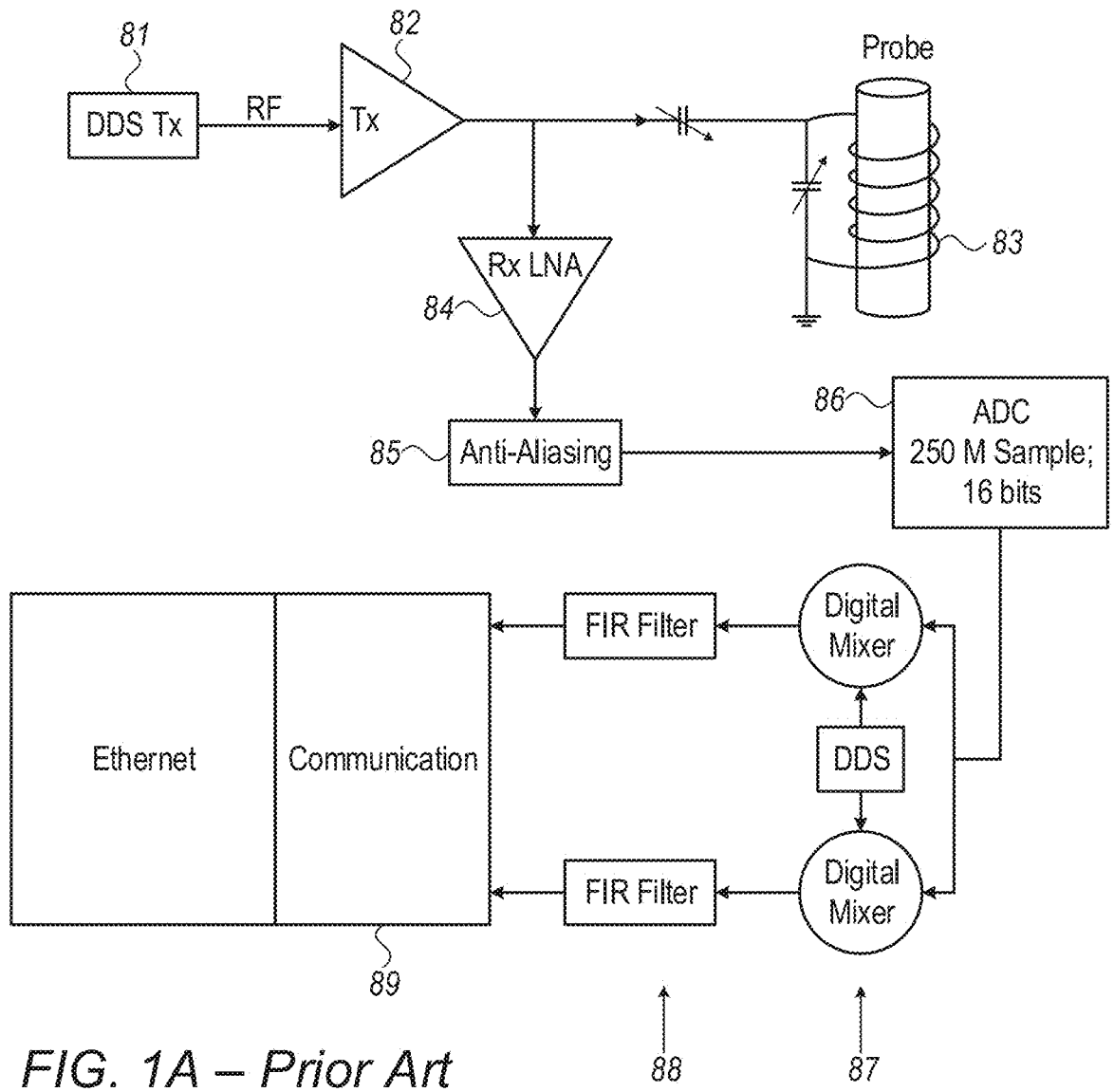
*FIG. 1A – Prior Art*
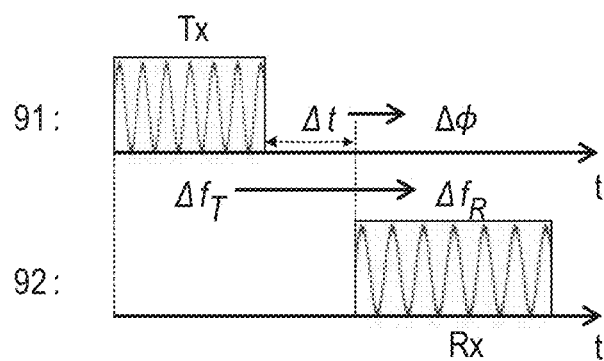
*FIG. 1B – Prior Art*

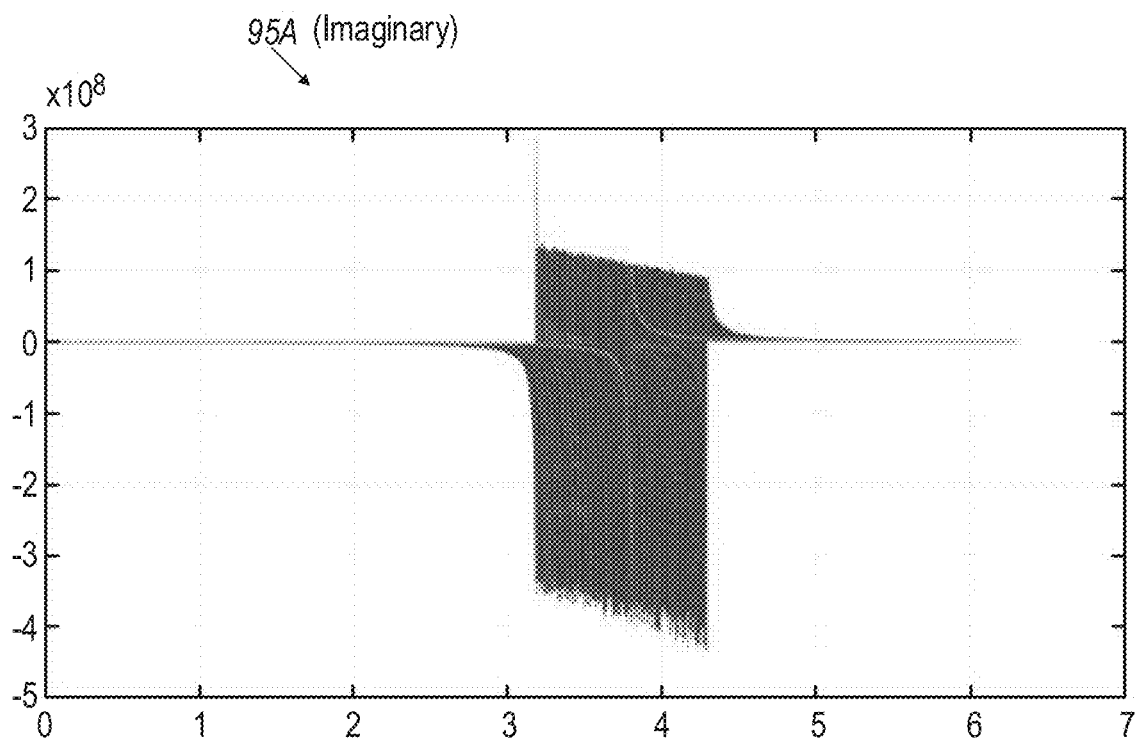
FIG. 2A – Prior Art
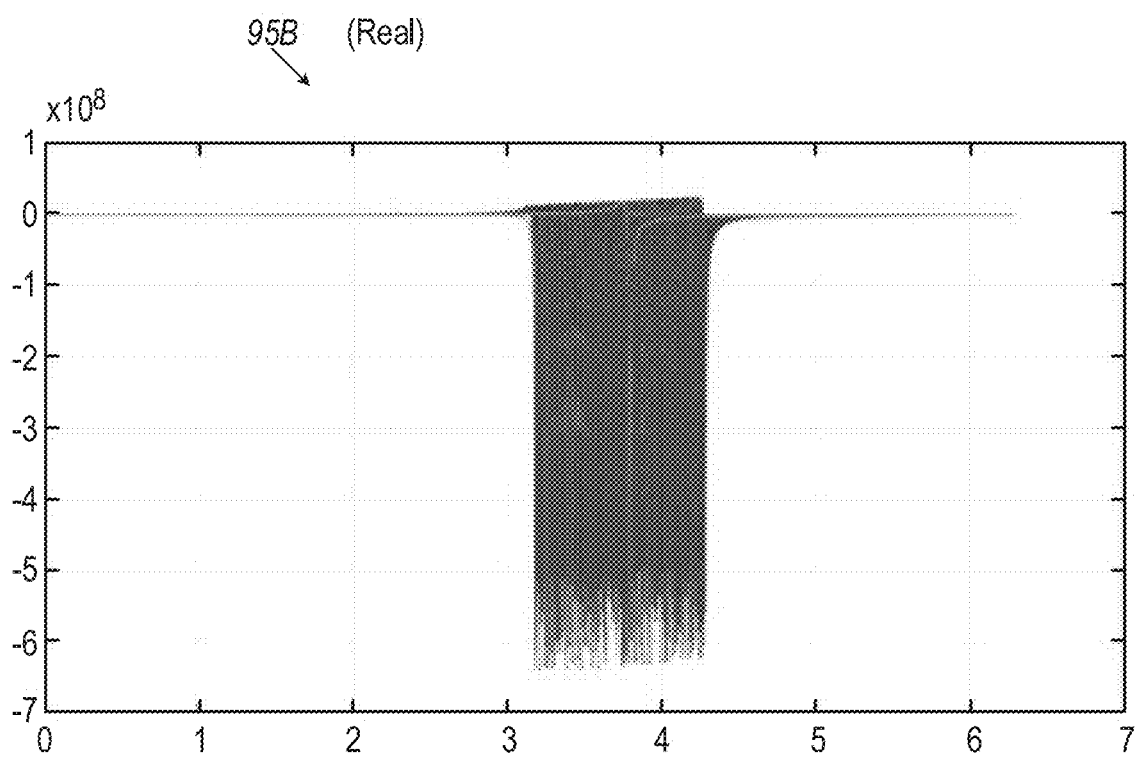
FIG. 2B – Prior Art

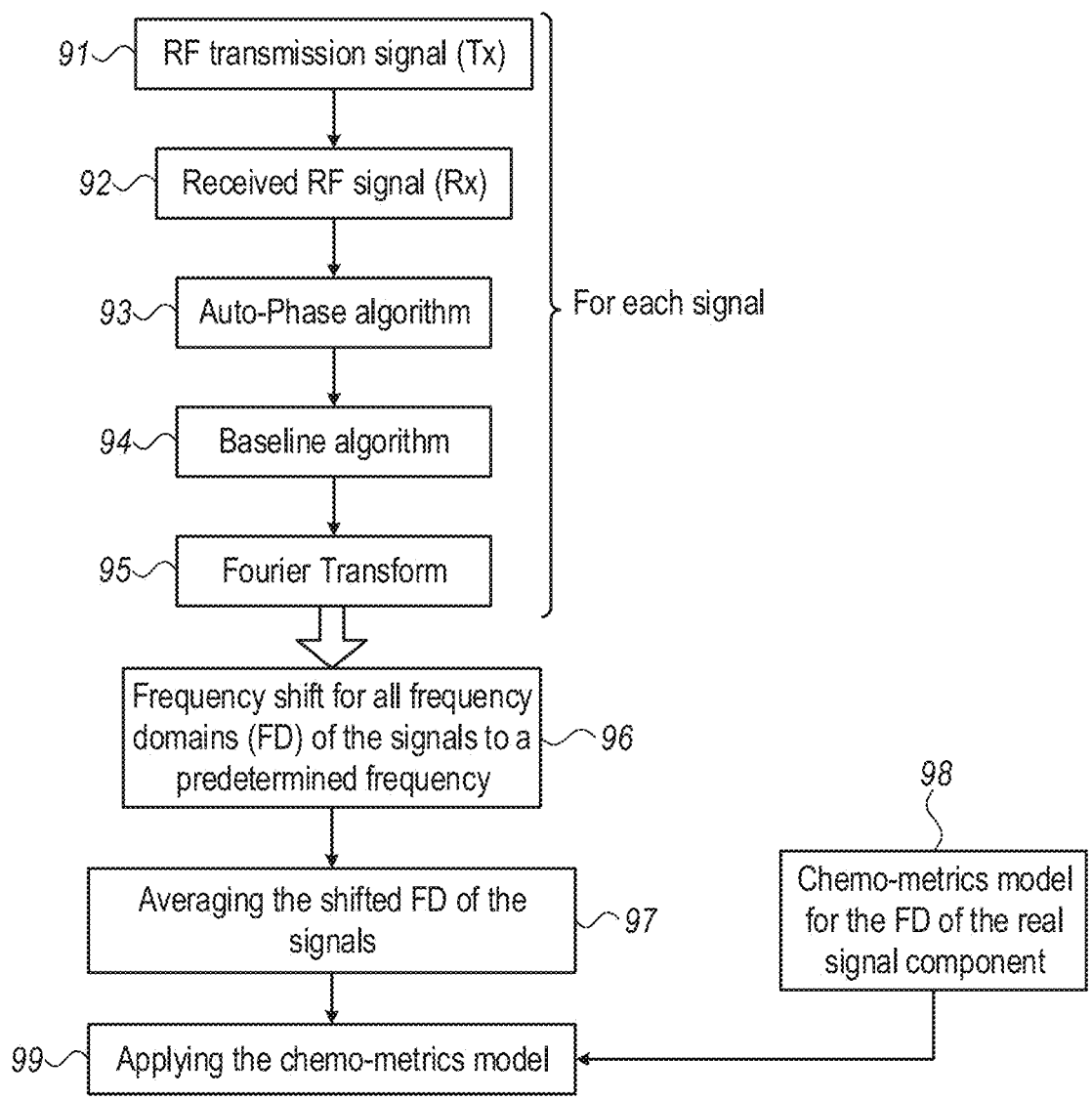
FIG. 3 – Prior Art

SIMULTANEOUSLY FREQUENCY- AND PHASE-SHIFTED NMR SIGNALS AND IMPROVED NMR SIGNAL ANALYSIS

CROSS REFERENCE TO RELATED APPLICATIONS

This application claims priority to U.S. Provisional Application No. 62/393,345 filed on Sep. 12, 2016, which is incorporated herein by reference in its entirety.

FIELD OF THE INVENTION

The present invention relates to the field of nuclear magnetic resonance (NMR), and more particularly, to NMR signal processing methods.

BACKGROUND OF THE INVENTION

During NMR measurements, frequency shift can occur, e.g., due to changes in magnet temperature. As a result, different RF signals received from a sample can have different frequencies and/or different phases. Current methods of NMR signal processing typically attempt to correct frequency and/or phase shifts, e.g., by applying so called Auto-Phase algorithms. However, these current methods can introduce errors in the analysis.

SUMMARY OF THE INVENTION

One aspect of the present invention provides a method for a NMR device to determine NMR measurement results of a sample from a set of RF signals emitted by the sample and received by the NMR device, the method includes: receiving, by the NMR device, a plurality of RF signals emitted by the sample; determining, by the NMR device, a phase shift of each signal of the plurality of RF signals based on a predetermined time difference; correcting, by the NMR device, a phase of each signal of the plurality of RF signals based on its respective determined phase shift; determining, by the NMR device, a frequency shift of each signal of the plurality of RF signals based on a predetermined reference frequency; shifting, by the NMR device, each signal of the plurality of RF signals to the predetermined frequency based on its respective determined frequency shift to generate corresponding plurality of shifted RF signals; correcting, by the NMR device, an additional phase shift of each signal of the shifted plurality of RF signals to generate corresponding plurality of corrected RF signals, wherein the additional phase shift of each of the shifted RF signals resulting from the shifting its respective RF signal to the predetermined reference frequency; and averaging, by the NMR device, the corrected RF signals to determine the NMR measurement result.

In some embodiments, the predetermined time difference is based on a type of the NMR device.

In some embodiments, the NMR device is a digital NMR device.

In some embodiments, the predetermined reference frequency is based on a type of the NMR device.

In some embodiments, the method further includes determining a chemometrics model based on both real and imaginary components of the corrected RF signals.

In some embodiments, the chemometrics model comprising at least one of: linear partial least square (PLS) analysis, linear principal component regression (PCR) analysis, neural network analysis, non-linear chemometrics models or any combination thereof.

In some embodiments, the method further includes applying a machine learning algorithm to the NMR measurement result, to process both real and imaginary components of the corrected RF signals, and further to determine a pattern relating the corrected RF signals to at least one measurement parameter.

In some embodiments, the machine learning algorithm is further to carry out at least one of: clustering the corrected RF signals and correlating the corrected RF signals to at least one physical characteristic of the sample.

Another aspect of the present invention provides a nuclear magnetic resonance (NMR) device for determining an NMR measurement result of a sample, the NMR system includes: a magnetic field assembly to transmit a plurality of RF signals to the sample and consecutively receive corresponding plurality of RF signals emitted by the sample; and at least one processor to: receive the plurality of RF signals emitted by the sample; determine a phase shift of each signal of the plurality of RF signals based on a predetermined time difference; correct a phase of each signal of the plurality of RF signals based on its respective determined phase shift; determine a frequency shift of each signal of the plurality of RF signals based on a predetermined reference frequency; shift each signal of the plurality of RF signals to the predetermined frequency based on its respective determined frequency shift to generate corresponding plurality of shifted RF signals; correct an additional phase shift of each signal of the shifted plurality of RF signals to generate corresponding plurality of corrected RF signals, wherein the additional phase shift of each of the shifted RF signals resulting from the shifting its respective RF signal to the predetermined reference frequency; and average the corrected RF signals to determine the NMR measurement result.

In some embodiments, the predetermined time difference is based on a type of the NMR device.

In some embodiments, the NMR device is a digital NMR device.

In some embodiments, the predetermined reference frequency is based on a type of the NMR device.

In some embodiments, the at least one processor is further to determine a chemometrics model based on both real and imaginary components of the corrected RF signals.

In some embodiments, the chemometrics model comprising at least one of: linear partial least square (PLS) analysis, linear principal component regression (PCR) analysis, neural network analysis, non-linear chemometrics models or any combination thereof.

In some embodiments, the at least one processor is further to apply the determined chemometrics model to the NMR measurement result.

In some embodiments, the at least one processor is further to apply a machine learning algorithm, which processes both real and imaginary components of the corrected RF signals, to the NMR measurement result, to determine a pattern relating the corrected RF signals to at least one measurement parameter.

In some embodiments, the machine learning algorithm is to cluster the corrected RF signals and/or correlate the corrected RF signals to at least one physical characteristic of the sample.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings:

FIG. 1A is a schematic block diagram an analog portion of a NMR signal processing system, according to an example of prior art;

FIG. 1B is a graph of generated radiofrequency (RF) signal and received RF signal, according to an example of prior art;

FIGS. 2A-2B are graphs of a frequency domain (FD) representation of an example of equivalent quadrature signals Q and I of multiple sequential RF Rx signals acquisitions, according to the prior art;

FIG. 3 is a flowchart of a prior art method of NMR signals processing;

DETAILED DESCRIPTION OF THE INVENTION

Figure 4:
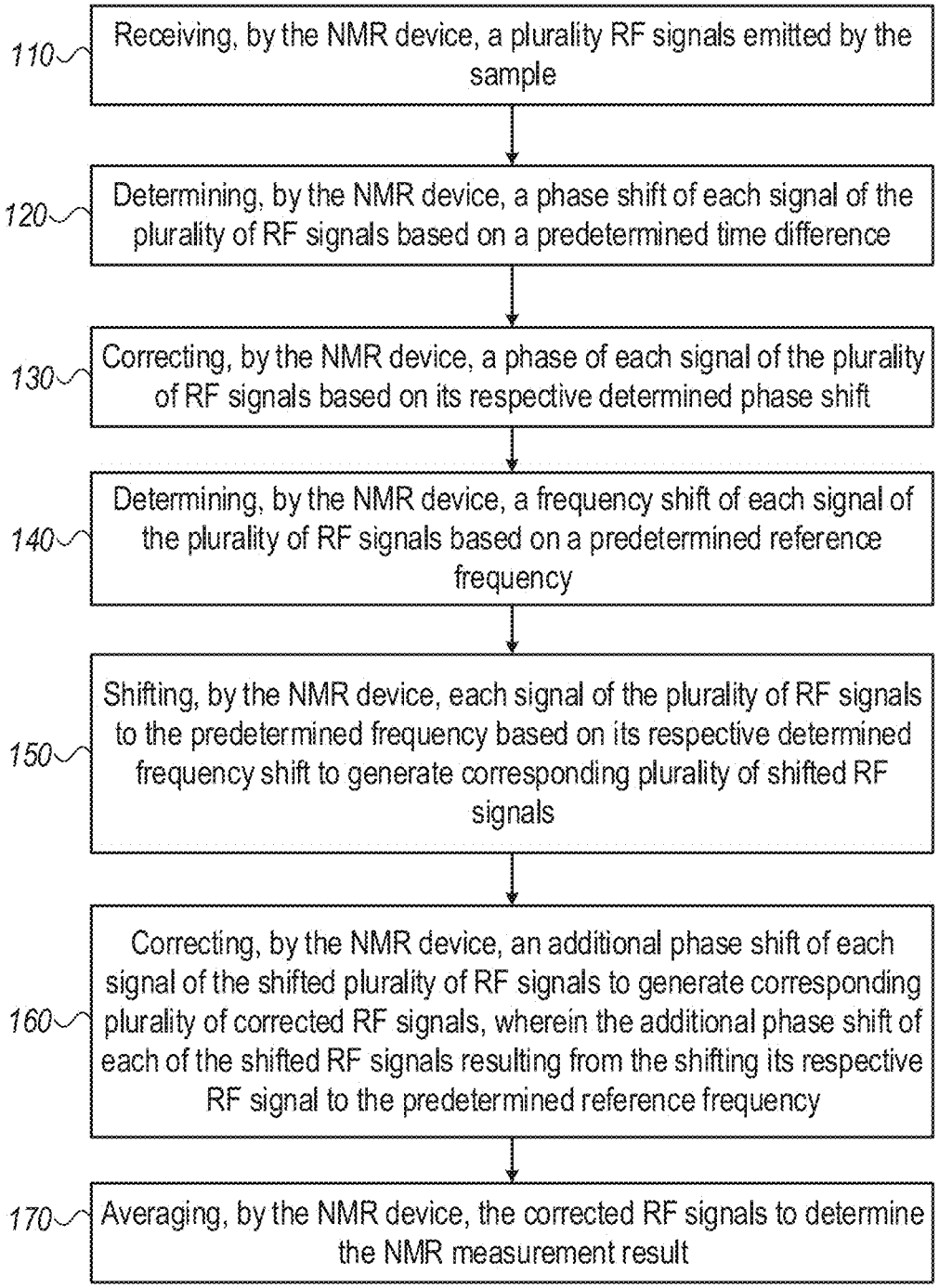
FIG. 4 is a flowchart illustrating a method for a NMR device to determine NMR measurement results of a sample from a set of RF signals emitted by the sample and received by the NMR device, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. Any of the disclosed modules or units can be at least partially implemented by a computer processor.

In order to produce a nuclear magnetic resonance (NMR) pulse signal that can be detected and/or converted to equivalent quadrature signals (e.g., channels I and Q) for an input to a digital signal processing in a computer, an extensive signal processing in the time domain can be required. Typical NMR signal processing systems can include analog and/or digital portions.

FIG. 1A is a schematic block diagram of an analog portion of a NMR signal processing system 80, according to an example of prior art. FIG. 1B is a graph of generated radiofrequency (RF) signal 91 and received RF signal 92, according to an example of prior art. The NMR signal processing system 80 can prepare a signal received, for example, from a radiofrequency (RF) coil of a NMR device for input to a computer (not shown) for further digital processing analysis. In the NMR signal processing system 80, a crystal oscillator (not shown) can generate a reference frequency output signal that can be further transmitted to a Direct Digital Synthesizer (DDS) 81. DDS 81 can generate a radiofrequency (RF) transmission (Tx) signal 91 (e.g., at $f_T$=60 MHz) which can be amplified in amplifier 82, using, for example, the reference frequency signal from the crystal oscillator. RF Tx signal 91 can be transmitted to a transmitter-receiver switch and/or can be switched (e.g., by the transmitter receiver switch) to a RF coil 83 that surrounds a sample 83A measured by NMR signal processing system 80, e.g., the sample 83A as is within a container or a pipe 83B.

The transmitted RF energy can be absorbed by the nuclei of the material of sample 83A and then, when the nuclei relax, RF energy can be emitted from the sample 83A, and the emitted RF energy can be received by RF coil 83. The RF coil 83 can generate a received RF signal (Rx) 92. A frequency of RF Rx signal 92 can be, for example, 60 MHz. RF Rx signal 92 can be transmitted to the transmitter-receiver switch and/or can be switched (e.g., by the transmitter-receiver switch) to the receiver input. RF signal 92 can be amplified by a Low Noise Amplifier (LNA) 84, filtered by an anti-aliasing filter 85 and/or digitalized by an Analog-to-Digital Converter (ADC) 86.

The digital RF Rx signal can be transmitted to a second DDS 87 that can split the digital RF Rx signal into two equivalent quadrature signals Q (also termed "imaginary" component of the digital RF Rx signal) and I (also termed "real" component of the digital RF Rx signal) 95A, 95B, respectively. Equivalent quadrature signals Q and I 95A, 95B can be phase-separated by 90°. Equivalent quadrature signals Q and I 95A, 95B can be filtered and can be decimated by digital Finite Impulse Response (FIR) filters 88. The filtered and decimated equivalent quadrature signals Q and I can be transmitted via a communication port 89 to a computer for a digital signal processing analysis.

In the computer, time domain equivalent quadrature digital signals Q and I 95A, 95B can be converted to the frequency domain (FD) using e.g., the Fourier Transform (FT). The FD quadrature digital signals Q and I can be processed by numerical methods and/or software functions (e.g., methods and software functions as are known in the art) to generate NMR spectrum data. The NMR spectrum data can represent a composition of measured sample 83A, typically using a chemometrics model. The FD signal generated from a single RF Rx signal 92 and/or from corresponding equivalent quadrature signals Q and I 95A, 95B, can have a low signal-to-noise (SNR) ratio, which can be improved by averaging multiple RF Rx signals 92 which are acquired sequentially.

The frequency of the received RF Rx signal can depend on a frequency generated by magnets of the NMR, which can be shifted slightly due to, for example, changes in operation conditions, such as temperature (denoted in FIG. 1 as $\Delta f_T$). Therefore, instead of received RF signals 92 and respective Q and I signals 95A, 95B being characterized by the same resonance frequency, each signal can be characterized by a slightly different resonance frequency, a phenomenon termed frequency shift (e.g., denoted in FIG. 1 as $\Delta f_R$). The transmission frequency shift can result in a phase shift $\Delta \phi$, which can be related to the time $\Delta t$ that passes between Tx signal 91 and Tx signal Rx.

FIG. 2A and FIG. 2B are graphs of a frequency domain (FD) representation of an example of equivalent quadrature signals Q and I of multiple sequential RF Rx signals acquisitions 95A, 95B, according to the prior art. FIG. 2A presents a FD of multiple Q signals 95A (i.e., the imaginary component of the RF Rx signals) and FIG. 2B presents a FD of multiple I signals 95B (i.e., the real component of the RF Rx signals). As seen in FIGS. 2A-2B, Q and I signals 95A, 95B from multiple signals acquisitions are slightly shifted with respect to each other. Due to the difference in resonance frequencies (e.g., as seen in FIGS. 2A-2B), an error can be introduced when averaging is applied on the multiple Q and I signals 95A, 95B.

FIG. 3 is a flowchart of a prior art method 90 of NMR signals processing. Method 90 includes transmitting a RF signal to a sample by a RF coil of an NMR device (stage 91) and consecutively receiving a RF signal (stage 92). Method 90 includes transforming the processed signal into the frequency domain, e.g., by a Fourier transform (stage 93) applying an Auto-Phase algorithm on the received RF signal (stage 94) and applying a Baseline algorithm on the received RF signal (stage 95). Method 90 includes acquiring a multiple RF signals in order to improve the SNR of the measurements (e.g., repeating stages 91, 92) and consecutively, applying stages 93, 94 and 95 on each RF signal acquired at stage 92, separately. It is noted that various Auto-Phase and Baseline algorithms are known in the art, and that all of which can be very sensitive to SNR and can lack repeatability (see an example in FIG. 2).

Method 90 further includes calculating a frequency shift for all the FD of the RF signals together, and shifting them to a predetermined frequency (stage 96), averaging all the shifted FDs of the RF signals (stage 97) and applying the chemometrics model to derive a NMR measurement result of the sample (stage 99), and possibly also developing a chemo-metrics model based on the shifted FD of the real components (i.e., equivalent I signal) of the RF signals (stage 98), as the prior art can be limited to utilizing only one of I, Q components due to, for example, the use of a single common frequency shift.

One difficulty with the current methods 90 is that errors introduced during the application of the various algorithms (e.g., Fourier transform, Auto-Phase algorithm and Baseline algorithm, stages 93-95) can be accumulated and may not corrected by the frequency shift, and therefore can reduce the accuracy of the results derived from the developed chemometrics model. As the developing of the chemometrics model (stage 98) may be based only on the shifted FD of the real components (e.g., equivalent I signal) of the RF signals, some of the information in the signal can be lost during processing.

FIG. 4 is a flowchart illustrating a method 100 for a NMR device to determine NMR measurement results of a sample from a set of RF signals emitted by the sample and received by the NMR device, according to some embodiments of the invention.

Method 100 can include receiving 110, by the NMR device, a plurality of RF signals emitted by the sample (e.g., the RF signals reflected from the sample upon transmission of RF signals to the sample, for example, by the NMR device). In some embodiments, method 100 includes digitalizing each of the received RF signal and/or applying a Fourier Transform on each of the received RF signal to generate a frequency domain (FD) of the received RF signals. In some embodiments, the NMR device is a digital NMR device.

Method 100 can include determining 120, by the NMR device, a phase shift of each signal of the plurality of RF signals based on a predetermined time difference. The predetermined time difference can based, for example, on a type of the NMR device.

Method 100 can include correcting 130, by the NMR device, a phase of each signal of the plurality of RF signals based on its respective determined phase shift.

Method 100 can include determining 140, by the NMR device, a frequency shift of each signal of the plurality of RF signals based on a predetermined reference frequency. In some embodiments, the predetermined reference frequency is based on a type of the NMR device.

Method 100 can include shifting 150, by the NMR device, each signal of the plurality of RF signals to the predetermined frequency based on its respective determined frequency shift to generate corresponding plurality of shifted RF signals.

Method 100 can include correcting 160, by the NMR device, an additional phase shift of each signal of the shifted plurality of RF signals to generate corresponding plurality of corrected RF signals, wherein the additional phase shift of each of the shifted RF signals resulting from the shifting its respective RF signal to the predetermined reference frequency.

Method 100 can include averaging 170, by the NMR device, the corrected RF signals to determine the NMR measurement result. The averaging of the corrected RF signals can, for example, improve the signal-to-noise ratio (SNR) of the determined NMR measurement result.

In some embodiments, method 100 includes determining a chemometrics model (e.g., that can relate an NMR measurement result to, for example, a parameter of a measured sample) based on both the real and/or the imaginary components (e.g., I and Q components) of the corrected RF signals to, for example, utilize the full information content of each of the RF signals. The chemometrics model can include, for example, various linear chemometrics models such as partial least square (PLS) analysis, principal component regression (PCR) analysis, neural network analysis etc. and/or non-linear chemo-metrics models. In some embodiments, method 100 includes applying the determined chemometrics model to the corrected RF signals to, for example, determine a parameter of the measured sample (e.g., a NMR prediction result).

Method 100 can include applying machine learning algorithms on the corrected RF signals to determine the NMR measurements results directly and/or in association with the chemometrics model and/or the adjusted chemometrics model. For example, the machine learning algorithms can find significant material changes in the measured material based on, for example, a NMR spectrum, e.g., by unsupervised stage(s) intended to reduce the dimensionality of the problem and to find its major alternating features and/or by supervised stage(s) based on lab data acquired alongside the NMR and aimed at training the system to identify correlations between the spectrum and the physical quantities of interest.

Figure 5A:
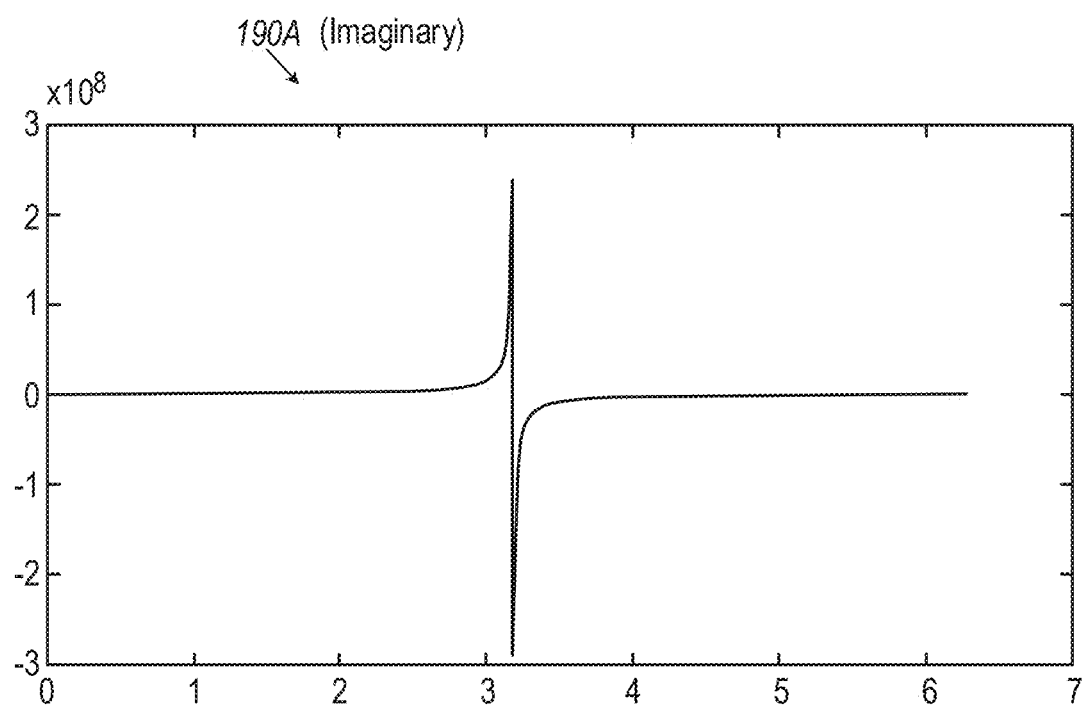
FIGS. 5A-5B are graphs of a frequency domain (FD) representation of an example of equivalent quadrature Q and I signals of the corrected RF signals, according to some embodiments of the invention.
Figure 5B:
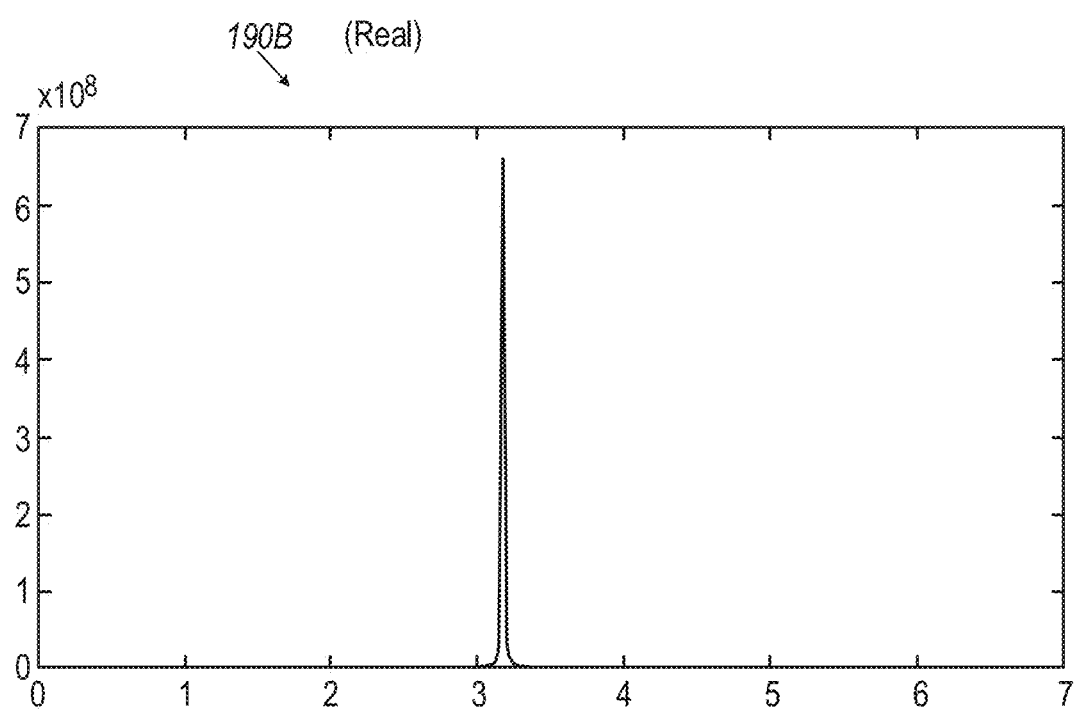

FIG. 5A and FIG. 5B are graphs of a frequency domain (FD) representation of an example of equivalent quadrature Q and I signals 190A, 190B of the corrected RF signals, according to some embodiments of the invention. FIG. 5A presents a FD of Q signals 190A (e.g., the imaginary component of the corrected RF signals) and FIG. 5B presents a FD of I signals 190B (e.g., the real component of the corrected RF signals). FIGS. 5A-5B illustrate the accuracy that can be achieved by method 100 when compared to prior art such as illustrated in FIG. 2. In fact, due to, for example, correction stages 110-170 of method 100, all signals can be processed to have the same exact (or substantially the same exact) resonance frequency without any phase shift (or substantially without any phase shift). Therefore, method 100 can prevent the introduction and/or the progression of errors during stages 93-95 of the current methods (e.g., as shown in FIG. 3) to reach, for example, much more accurate results in comparison with the prior art. Moreover, the consecutive averaging of multiple corrected RF signals to increase the SNR may not add up errors from signals which diverge in their resonance frequency and/or in their phases as in the prior art methods. Method 100 can generate an overall much more accurate signal and therefore can provide improvements to the technology field of NMR analysis, e.g., by improving accuracy, robustness and/or repeatability. Method 100 can include an improvement in accuracy by about an order of magnitude, from 0.1% to 0.01%, as indicated in FIG. 5 compared to FIG. 2.

Figure 6:
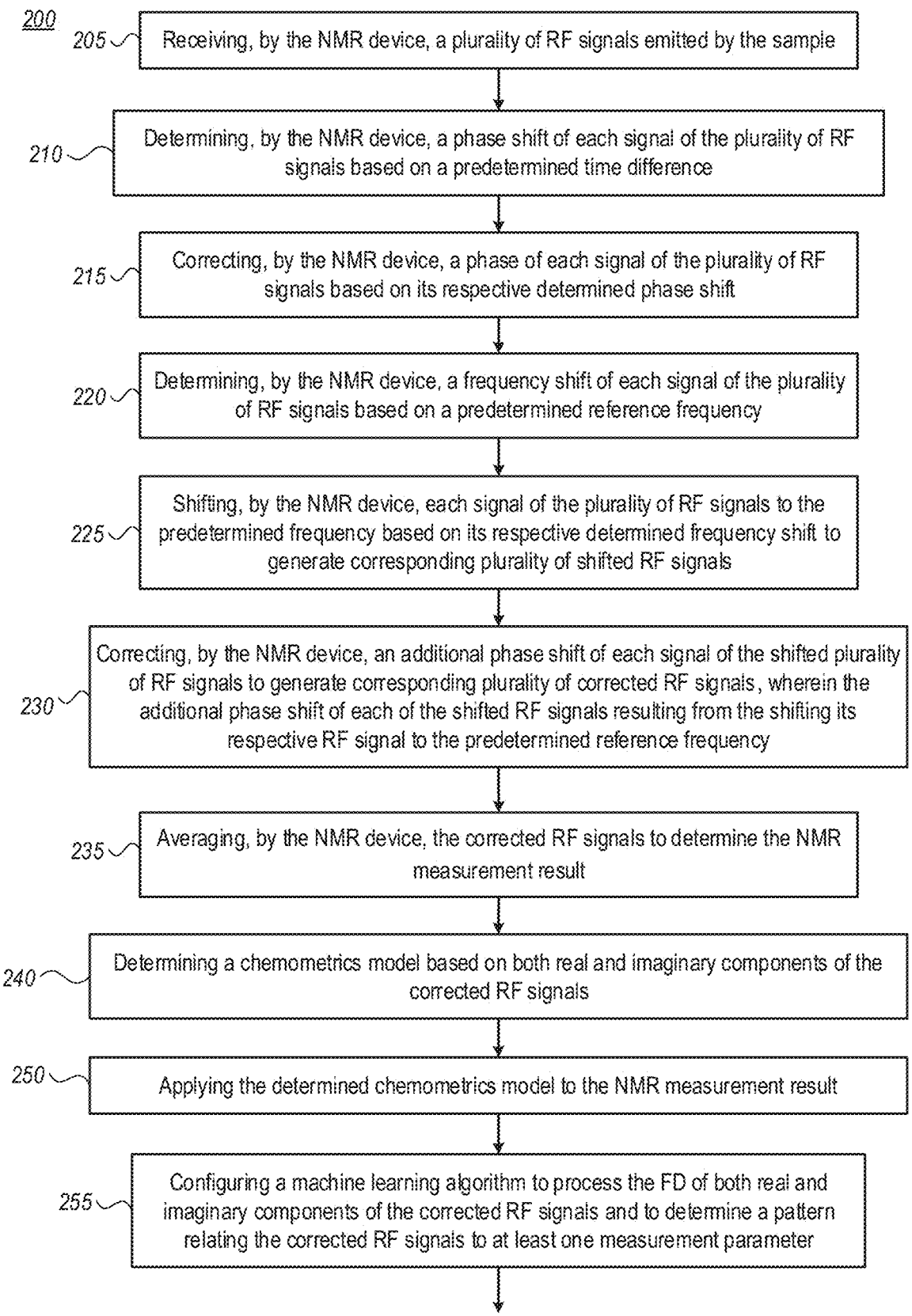
FIG. 6 is a flowchart illustrating a NMR analysis method, according to some embodiments of the invention.
Figure 6:
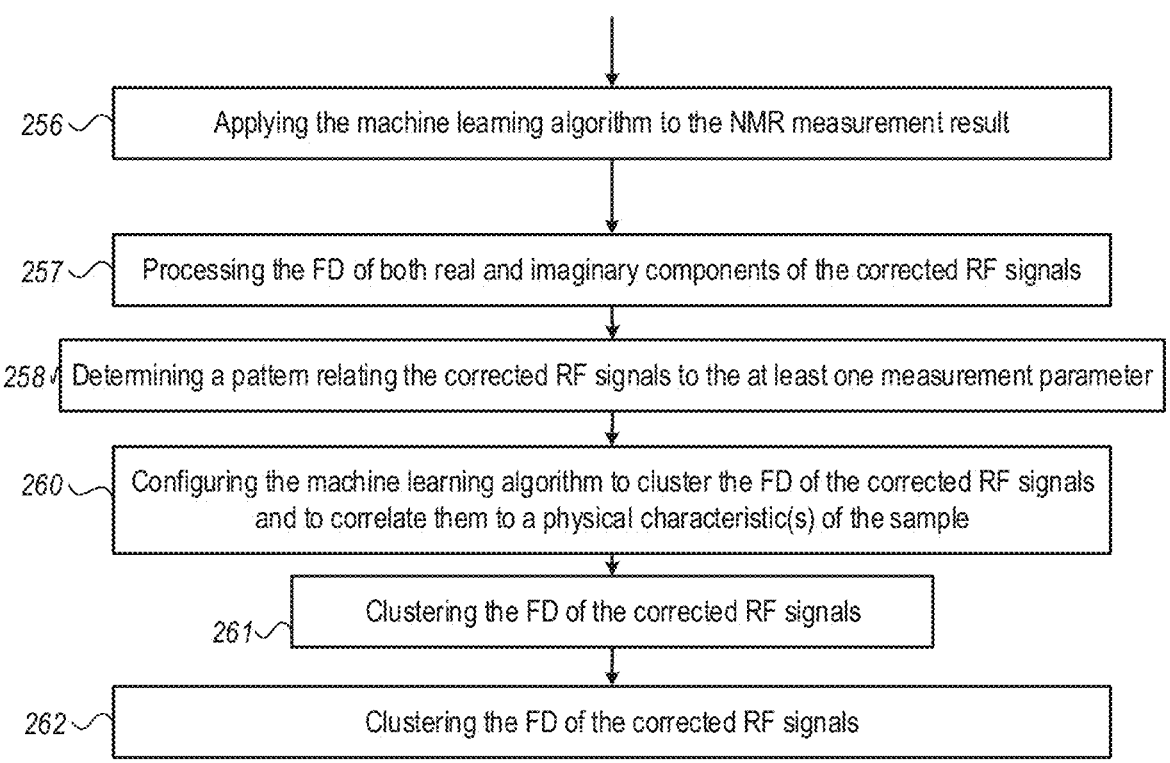

FIG. 6 is a flowchart illustrating a NMR analysis method 200, according to some embodiments of the invention.

Method 200 can include receiving 205, by the NMR device, a plurality of RF signals emitted by the sample (e.g., the RF signals reflected from the sample upon transmission of RF signals to the sample, for example, by the NMR device). In some embodiments, method 200 includes digitalizing each of the received RF signal and/or applying a Fourier Transform on each of the received RF signal to generate a frequency domain (FD) of the received RF signals. In some embodiments, the NMR device is a digital NMR device.

Method 200 can include determining 210, by the NMR device, a phase shift of each signal of the plurality of RF signals based on a predetermined time difference. The predetermined time difference can be based, for example, on a type the NMR device.

Method 200 can include correcting 215, by the NMR device, a phase of each signal of the plurality of RF signals based on its respective determined phase shift.

Method 200 can include determining 220, by the NMR device, a frequency shift of each signal of the plurality of RF signals based on a predetermined reference frequency. In some embodiments, the predetermined reference frequency is based on a type of the NMR device.

Method 200 can include shifting 225, by the NMR device, each signal of the plurality of RF signals to the predetermined frequency based on its respective determined frequency shift to generate corresponding plurality of shifted RF signals.

Method 200 can include correcting, by the NMR device, an additional phase shift of each signal of the shifted plurality of RF signals to generate corresponding plurality of corrected RF signals, wherein the additional phase shift of each of the shifted RF signals resulting from the shifting its respective RF signal to the predetermined reference frequency.

Method 200 can include averaging, by the NMR device, the corrected RF signals to determine the NMR measurement result. The averaging of the corrected RF signals can, for example, improve the signal-to-noise ratio (SNR) of the determined NMR measurement result.

Method 200 can include determining 240 a chemometrics model (e.g., that can relate an NMR measurement result to, for example, a parameter of a measured sample) based on both real and imaginary components of the corrected RF signals to, for example, utilize the full information content of each of the RF signals.

Method 200 can also include applying 250 the determined chemometrics model to the NMR measurement result to, for example, determine a parameter of the measured sample (e.g., a NMR prediction result).

Method 200 can include configuring 255 a machine learning algorithm to process the FD of both real and imaginary components of the corrected RF signals and/or to determine a pattern relating the corrected RF signals to at least one measurement parameter. Method 200 can also include applying 256 the machine learning algorithm to the NMR measurement result. Method 200 can also include processing 257 the FD of both real and imaginary components of the corrected RF signals. Method 200 can also include determining 258 a pattern relating the corrected RF signals to the at least one measurement parameter.

Method 200 can also include configuring 260 the machine learning algorithm to cluster the FD of the corrected RF signals and to correlate them to a physical characteristic(s) of the sample. Method 200 can also include clustering 261 the FD of the corrected RF signals. Method 200 can also include clustering 262 the FD of the corrected RF signals.

Figure 7:
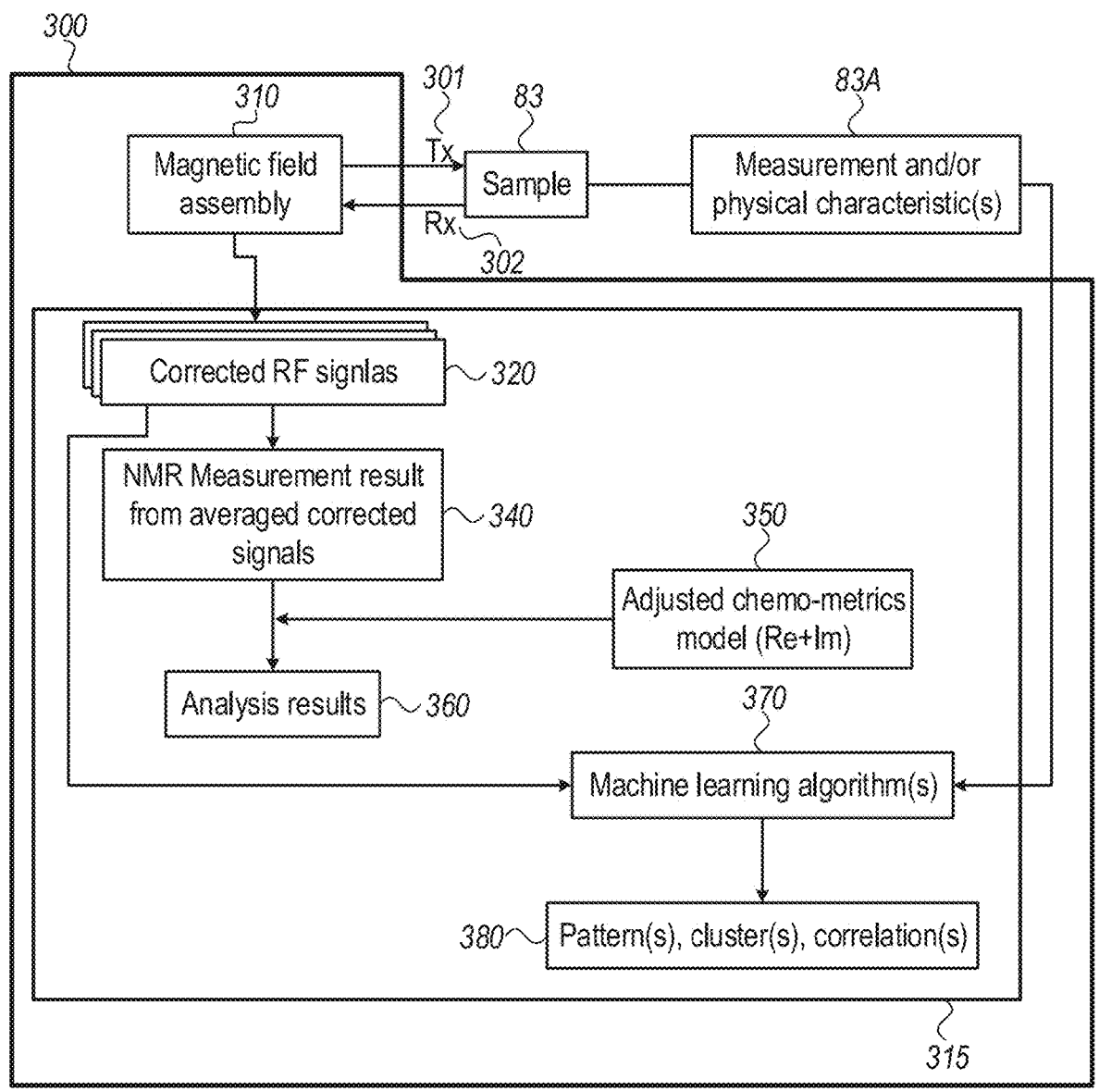
FIG. 7 is a schematic illustration of a NMR device for determining an NMR measurement result of a sample, according to some embodiments of the invention.

FIG. 7 is a schematic illustration of a NMR device 300 for determining an NMR measurement result of a sample, according to some embodiments of the invention. System 300 can include a magnetic field assembly 310 that can transmit a plurality of RF signals 301 to the sample 83 and consecutively receive corresponding plurality of RF signals 302 emitted by the sample.

System 300 can include at least one computer processor 315 that can carry out any of stages of method 100 and/or method 200. For example, at least one computer processor 315 in system 300 can: (i) receive the plurality of RF signals emitted by the sample; (ii) determine a phase shift of each signal of the plurality of RF signals based on a predetermined time difference; (iii) correct a phase of each signal of the plurality of RF signals based on its respective determined phase shift; (iv) determine a frequency shift of each signal of the plurality of RF signals based on a predetermined reference frequency; (v) shift each signal of the plurality of RF signals to the predetermined frequency based on its respective determined frequency shift to generate corresponding plurality of shifted RF signals; (vi) correct an additional phase shift of each signal of the shifted plurality of RF signals to generate corresponding plurality of corrected RF signals 320, wherein the additional phase shift of each of the shifted RF signals resulting from the shifting its respective RF signal to the predetermined reference frequency; and (vii) average the corrected RF signals to determine the NMR measurement result 340.

In some embodiments, the NMR device is a digital NMR device. In some embodiments, the predetermined time difference is based on a type of the NMR device. In some embodiments, the predetermined reference frequency is based on a type of the NMR device.

In some embodiments, at least one computer processor 315 to determine a chemometrics model based on both the real and the imaginary components (e.g., I and Q signals) of the received RF signals and to perform 360 an analysis of the results.

In some embodiments, the at least one computer processor 315 to apply a machine learning algorithm 370 to both real and imaginary components (e.g., equivalent quadrature I and Q signals) of corrected RF signals 320, and to determine patterns relating the corrected RF signals to at least one measurement parameter 83A of sample 83, clusters of the corrected RF signals and/or correlations of the corrected RF signals to at least one physical characteristic 83A of sample 83, denoted collectively by numeral 380 in FIG. 7.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions can also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram portion or portions thereof. The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram portion or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams can represent a module, segment, or portion of code, which includes one or more executable instructions for implementing the specified logical function(s). It should also be noted that, in some alternative implementations, the functions noted in the portion can occur out of the order noted in the figures. For example, two portions shown in succession can, in fact, be executed substantially concurrently, or the portions can sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A method to determine a NMR measurement result of a sample from a plurality of RF signals emitted by the sample, the method comprising:
   receiving, by a processor, a plurality of RF signals emitted by the sample undergoing NMR measurement by a NMR device;
   determining, by the processor, a phase shift of each signal of the plurality of RF signals based on a predetermined time difference;

correcting, by the processor, a phase of each signal of the plurality of RF signals based on its respective determined phase shift;

determining, by the processor, a frequency shift of each signal of the plurality of RF signals based on a predetermined reference frequency;

shifting, by the processor, each signal of the plurality of RF signals to the predetermined frequency based on its respective determined frequency shift to generate a corresponding plurality of shifted RF signals;

correcting, by the processor, an additional phase shift of each signal of the plurality of shifted RF signals to generate a corresponding plurality of corrected RF signals, wherein the additional phase shift of each of the plurality of shifted RF signals results from the shifting of its respective signal of the plurality of RF signals; and averaging, by the processor, the plurality of corrected RF signals to determine the NMR measurement result.

2. The method of claim 1, wherein the predetermined time difference is based on a type of the NMR device.

3. The method of claim 1, wherein the predetermined reference frequency is based on a type of the NMR device.

4. The method of claim 1, further comprising determining, by the processor, a chemometrics model based on both real and imaginary components of the plurality of corrected RF signals, and applying, by the processor, the chemometrics model to the NMR measurement result to determine a parameter of the sample.

5. The method of claim 4, wherein the chemometrics model comprises at least one of a linear partial least square (PLS) analysis module, a linear principal component regression (PCR) analysis module, and a non-linear chemometrics model.

6. The method of claim 1, further comprising processing, by the processor applying a machine learning algorithm, both real and imaginary components of the plurality of corrected RF signals, and further determining a pattern relating the plurality of corrected RF signals to at least one measurement parameter.

7. The method of claim 6, further comprising, wherein the machine learning algorithm is further to carry out at least one of:

clustering, by the processor applying the machine learning algorithm, the plurality of corrected RF signals; and correlating, by the processor applying the machine learning algorithm, the plurality of corrected RF signals to at least one physical characteristic of the sample.

8. The method of claim 1, further comprising:

receiving, by a magnetic field assembly, the plurality of RF signals emitted by the sample, wherein receiving, by the processor, the plurality of RF signals emitted by the sample undergoing NMR measurement by the NMR device includes receiving the plurality of RF signals from the magnetic field assembly.

9. An apparatus for determining an NMR measurement result of a sample, the NMR system comprising:

at least one processor configured to:

receive a plurality of RF signals emitted by the sample undergoing NMR measurement by a NMR device;

determine a phase shift of each signal of the plurality of RF signals based on a predetermined time difference;

correct a phase of each signal of the plurality of RF signals based on its respective determined phase shift;

determine a frequency shift of each signal of the plurality of RF signals based on a predetermined reference frequency;

shift each signal of the plurality of RF signals to the predetermined frequency based on its respective determined frequency shift to generate a corresponding plurality of shifted RF signals;

correct an additional phase shift of each signal of the plurality of shifted RF signals to generate a corresponding plurality of corrected RF signals, wherein the additional phase shift of each of the plurality of shifted RF signals results from the shifting of its respective signal of the plurality of RF signals; and average the plurality of corrected RF signals to determine the NMR measurement result.

10. The apparatus of claim 9, wherein the predetermined time difference is based on a type of the NMR device.

11. The apparatus of claim 9, wherein the predetermined reference frequency is based on a type of the NMR device.

12. The apparatus of claim 9, wherein the at least one processor is further configured to determine a chemometrics model based on both real and imaginary components of the plurality of corrected RF signals and to apply the chemometrics module to the NMR measurement result to determine a parameter of the sample.

13. The apparatus of claim 12, wherein the chemometrics model comprises at least one of a linear partial least square (PLS) analysis model, a linear principal component regression (PCR) analysis model, a neural network analysis model, and a non-linear chemometrics model.

14. The apparatus of claim 9, wherein the at least one processor is further configured to apply a machine learning algorithm to process both real and imaginary components of the corrected RF signals to determine a pattern relating the plurality of corrected RF signals to at least one measurement parameter.

15. The apparatus of claim 14, wherein the at least one processor is further configured to apply the machine learning algorithm to at least one of: cluster the plurality of corrected RF signals and correlate the plurality of corrected RF signals to at least one physical characteristic of the sample.

16. The apparatus of claim 9, wherein the processor is configured as at least one of:

a special purpose hardware module; and a programmable processing apparatus configured to execute one or more instructions stored on a computer readable medium.

17. The apparatus of claim 9, further comprising:

a magnetic field assembly configured to receive the plurality of RF signals emitted by the sample, wherein the at least one processor is further configured to receive the plurality of RF signals emitted by the sample undergoing NMR measurement by the NMR device from the magnetic field assembly.

* * * * *